United States Patent
Paquette et al.

(10) Patent No.: US 8,537,552 B2
(45) Date of Patent: Sep. 17, 2013

(54) HEAT SINK INTERFACE HAVING THREE-DIMENSIONAL TOLERANCE COMPENSATION

(75) Inventors: Jeffrey Paquette, Newton, MA (US); Scott R. Cheyne, Brookline, MA (US); Joseph R. Ellsworth, Pelham, NH (US); Michael P. Martinez, Worcester, MA (US); Michael R. Trahan, Northbridge, MA (US)

(73) Assignee: Raytheon Company, Waltham, MA (US)

( * ) Notice: Subject to any disclaimer, the term of this patent is extended or adjusted under 35 U.S.C. 154(b) by 445 days.

(21) Appl. No.: 12/566,818

(22) Filed: Sep. 25, 2009

(65) Prior Publication Data

US 2011/0075377 A1   Mar. 31, 2011

(51) Int. Cl.
- *H05K 7/20* (2006.01)
- *F28F 7/00* (2006.01)
- *H01Q 11/00* (2006.01)

(52) U.S. Cl.
USPC ............ 361/710; 361/717; 361/711; 165/185

(58) Field of Classification Search
USPC ................ 361/709, 710, 711, 717; 165/185
See application file for complete search history.

(56) References Cited

U.S. PATENT DOCUMENTS

| | | | |
|---|---|---|---|
| 2,711,382 A * | 6/1955 | Smith-Johannsen | ......... 156/227 |
| 3,091,743 A | 5/1963 | Wilkinson | |
| 3,665,480 A | 5/1972 | Fassett | |
| 3,883,834 A * | 5/1975 | Osteen | ............................ 336/61 |
| 4,442,450 A * | 4/1984 | Lipschutz et al. | ............ 257/713 |
| 4,489,363 A | 12/1984 | Goldberg | |
| 4,527,165 A | 7/1985 | deRonde | |
| 4,612,601 A * | 9/1986 | Watari | ......................... 361/705 |
| 4,654,754 A * | 3/1987 | Daszkowski | .................. 361/708 |
| 4,698,663 A | 10/1987 | Sugimoto et al. | |
| 4,706,094 A | 11/1987 | Kubick | |
| 4,751,513 A | 6/1988 | Daryoush et al. | |
| 4,770,242 A * | 9/1988 | Daikoku et al. | .............. 165/185 |
| 4,835,658 A | 5/1989 | Bonnefoy | |

(Continued)

FOREIGN PATENT DOCUMENTS

| EP | 0 481 417 A | 4/1992 |
|---|---|---|
| EP | 1 764 863 A1 | 3/2007 |

(Continued)

OTHER PUBLICATIONS

"S-band Modular Integrated Panel (S-MIP) Radar;" Proposal White Paper; copyright 2007 Raytheon Company; 17 pages.

(Continued)

*Primary Examiner* — Bradley Thomas
(74) *Attorney, Agent, or Firm* — Daly, Crowley, Mofford & Durkee, LLP

(57) ABSTRACT

A thermal interface includes a plurality of elevated regions and a plurality of mechanical tolerance circuits coupled to the plurality of elevated regions. The thermal interface is configured to be disposed between an array of heat generating elements and a heat sink with each of the plurality of elevated regions thermally coupled to a corresponding one or more of the array of heat generating elements. In one embodiment, the thermal interface provides a thermal path between a printed wiring board having a plurality of flip-chip circuit components disposed on an external surface thereof and a heat sink disposed over the flip-chip circuit components.

22 Claims, 13 Drawing Sheets

(56) References Cited

U.S. PATENT DOCUMENTS

| | | | |
|---|---|---|---|
| 4,964,458 A * | 10/1990 | Flint et al. | 165/80.4 |
| 5,005,019 A | 4/1991 | Zaghloul et al. | |
| 5,022,462 A * | 6/1991 | Flint et al. | 165/80.4 |
| 5,055,852 A | 10/1991 | Dusseux et al. | |
| 5,099,254 A | 3/1992 | Tsukii et al. | |
| 5,159,531 A * | 10/1992 | Horvath et al. | 361/704 |
| 5,168,348 A * | 12/1992 | Chu et al. | 257/713 |
| 5,184,211 A | 2/1993 | Fox | 257/706 |
| 5,270,902 A * | 12/1993 | Bellar et al. | 361/718 |
| 5,276,455 A | 1/1994 | Fitzsimmons et al. | |
| 5,345,107 A * | 9/1994 | Daikoku et al. | 257/717 |
| 5,398,010 A | 3/1995 | Klebe | |
| 5,400,040 A | 3/1995 | Lane et al. | |
| 5,404,148 A | 4/1995 | Zwarts | |
| 5,438,477 A * | 8/1995 | Pasch | 361/689 |
| 5,451,969 A | 9/1995 | Toth et al. | |
| 5,459,474 A | 10/1995 | Mattioli et al. | |
| 5,488,380 A | 1/1996 | Harvey et al. | |
| 5,493,305 A | 2/1996 | Wooldridge et al. | |
| 5,548,090 A * | 8/1996 | Harris | 174/252 |
| 5,563,613 A | 10/1996 | Schroeder et al. | |
| 5,592,363 A | 1/1997 | Atarashi et al. | |
| 5,646,826 A | 7/1997 | Katchmar | |
| 5,650,914 A * | 7/1997 | DiStefano et al. | 361/704 |
| 5,675,345 A | 10/1997 | Pozgay et al. | |
| 5,724,048 A | 3/1998 | Remondiere | |
| 5,786,792 A | 7/1998 | Bellus et al. | |
| 5,796,582 A | 8/1998 | Katchmar | |
| 5,854,607 A | 12/1998 | Kinghorn | |
| 5,896,269 A * | 4/1999 | Autry | 361/704 |
| 5,907,304 A | 5/1999 | Wilson et al. | |
| 6,011,507 A | 1/2000 | Curran et al. | |
| 6,037,658 A * | 3/2000 | Brodsky et al. | 257/707 |
| 6,037,903 A | 3/2000 | Lange et al. | |
| 6,061,027 A | 5/2000 | Legay et al. | |
| 6,078,289 A | 6/2000 | Manoogian et al. | |
| 6,087,988 A | 7/2000 | Pozgay | |
| 6,091,373 A | 7/2000 | Raguenet | |
| 6,104,343 A | 8/2000 | Brookner et al. | |
| 6,127,985 A | 10/2000 | Guler | |
| 6,131,646 A * | 10/2000 | Kelley | 165/80.1 |
| 6,166,705 A | 12/2000 | Mast et al. | |
| 6,181,280 B1 | 1/2001 | Kadambi et al. | |
| 6,184,832 B1 | 2/2001 | Geyh et al. | |
| 6,208,316 B1 | 3/2001 | Cahill | |
| 6,211,824 B1 | 4/2001 | Holden et al. | |
| 6,218,214 B1 | 4/2001 | Panchou et al. | |
| 6,222,493 B1 | 4/2001 | Caille et al. | |
| 6,225,695 B1 | 5/2001 | Chia et al. | |
| 6,297,775 B1 | 10/2001 | Haws et al. | |
| 6,367,541 B2 * | 4/2002 | McCullough | 165/80.3 |
| 6,388,620 B1 | 5/2002 | Bhattacharyya | |
| 6,392,890 B1 | 5/2002 | Katchmar | |
| 6,424,313 B1 | 7/2002 | Navarro et al. | |
| 6,480,167 B2 | 11/2002 | Matthews | |
| 6,483,705 B2 | 11/2002 | Snyder et al. | |
| 6,496,373 B1 * | 12/2002 | Chung | 361/705 |
| 6,580,402 B2 | 6/2003 | Navarro et al. | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,731,189 B2 | 5/2004 | Puzella et al. | |
| 6,756,684 B2 | 6/2004 | Huang | |
| 6,774,482 B2 * | 8/2004 | Colgan et al. | 257/712 |
| 6,830,960 B2 * | 12/2004 | Alcoe et al. | 438/122 |
| 6,856,210 B2 | 2/2005 | Zhu et al. | |
| 6,900,765 B2 | 5/2005 | Navarro et al. | |
| 6,922,272 B1 * | 7/2005 | de Groot et al. | 359/291 |
| 6,942,025 B2 * | 9/2005 | Nair et al. | 165/185 |
| 6,943,330 B2 | 9/2005 | Ring | |
| 6,961,248 B2 | 11/2005 | Vincent et al. | |
| 6,995,322 B2 | 2/2006 | Chan et al. | |
| 7,030,712 B2 | 4/2006 | Brunette et al. | |
| 7,042,729 B2 * | 5/2006 | Dias et al. | 361/708 |
| 7,061,446 B1 | 6/2006 | Short, Jr. et al. | |
| 7,077,858 B2 * | 7/2006 | Fletcher et al. | 607/104 |
| 7,129,908 B2 | 10/2006 | Edward et al. | |
| 7,132,990 B2 | 11/2006 | Stenger et al. | |
| 7,180,745 B2 | 2/2007 | Mandel et al. | |
| 7,187,342 B2 | 3/2007 | Heisen et al. | |
| 7,200,006 B2 * | 4/2007 | Farrow et al. | 361/704 |
| 7,348,932 B1 | 3/2008 | Puzella et al. | |
| 7,361,985 B2 * | 4/2008 | Yuan et al. | 257/713 |
| 7,394,659 B2 * | 7/2008 | Colgan et al. | 361/718 |
| 7,417,598 B2 | 8/2008 | Navarro et al. | |
| 7,443,354 B2 | 10/2008 | Navarro et al. | |
| 7,444,737 B2 | 11/2008 | Worl | |
| 7,489,283 B2 | 2/2009 | Ingram et al. | |
| 7,508,338 B2 | 3/2009 | Pluymers et al. | |
| 7,518,066 B2 * | 4/2009 | Thompson et al. | 174/262 |
| 7,597,534 B2 | 10/2009 | Hopkins | |
| 7,748,440 B2 * | 7/2010 | Michel et al. | 165/185 |
| 2002/0051342 A1 | 5/2002 | Kanada | |
| 2005/0110681 A1 | 5/2005 | Londre | |
| 2005/0151215 A1 * | 7/2005 | Hauhe et al. | 257/421 |
| 2006/0268518 A1 | 11/2006 | Edward et al. | |
| 2007/0044422 A1 * | 3/2007 | Thompson et al. | 52/698 |
| 2007/0047209 A1 * | 3/2007 | Thompson et al. | 361/710 |
| 2007/0152882 A1 | 7/2007 | Hash et al. | |
| 2007/0159799 A1 * | 7/2007 | Dando et al. | 361/709 |
| 2007/0177367 A1 * | 8/2007 | Bailey et al. | 361/808 |
| 2007/0230133 A1 * | 10/2007 | Michel et al. | 361/708 |
| 2008/0074324 A1 | 3/2008 | Puzella et al. | |
| 2008/0106467 A1 | 5/2008 | Navarro et al. | |
| 2008/0106482 A1 | 5/2008 | Cherrette et al. | |
| 2008/0150832 A1 | 6/2008 | Ingram et al. | |
| 2008/0316139 A1 | 12/2008 | Blaser et al. | |

FOREIGN PATENT DOCUMENTS

| | | |
|---|---|---|
| EP | 1 436 859 B1 | 8/2007 |
| EP | 1 978 597 A1 | 10/2008 |
| JP | 61224504 | 10/1986 |
| JP | 4-122107 A | 4/1992 |
| JP | 06-097710 | 4/1994 |
| JP | 7-212125 | 8/1995 |
| JP | 2000-138525 A | 5/2000 |
| JP | 2003179429 A | 6/2003 |
| JP | 2005-505963 | 2/2005 |
| KR | 1020010079872 A | 8/2001 |
| WO | WO 98/26642 | 6/1998 |
| WO | WO 99/66594 | 12/1999 |
| WO | WO 01/06821 A1 | 1/2001 |
| WO | WO 01/20720 A1 | 3/2001 |
| WO | WO 01/33927 A1 | 5/2001 |
| WO | WO 01/41257 A1 | 6/2001 |
| WO | WO 03/003031 A1 | 4/2003 |
| WO | WO 03/030301 A1 | 4/2003 |
| WO | WO 2007/136941 A2 | 11/2007 |
| WO | WO 2007/136941 A3 | 11/2007 |
| WO | WO 2008/010851 A2 | 1/2008 |
| WO | WO 2008/010851 A3 | 1/2008 |
| WO | WO 2008/036469 A1 | 3/2008 |

OTHER PUBLICATIONS

Carter; "'Fuzz Button' interconnects and microwave and mm-wave frequencies;" IEEE Seminar, London, UK; Mar. 1-7, 2000; 7 pages.

Jerinic et al.; "X-Band "Tile" Array for Mobil Radar;" internal Raytheon Company publication; Spring 2003; 4 pages.

Puzella et al.; "Digital Subarray for Large Apertures;" slide presentation; internal Raytheon Company publication; Spring 2003; pp. 1-22.

Puzella et al.; "Radio Frequency Interconnect Circuits and Techniques;" U.S. Appl. No. 11/558,126, filed Nov. 9, 2006; 57 pages.

Puzella et al.; "X-Band Tile Sub-Array;" slide presentation; internal Raytheon Company publication; Spring 2003; 28 pages.

Puzella; "Deliverable Demonstration Sub-Array;" slide presentation; internal Raytheon Company publication; Fall 2003; pp. 1-17.

PCT International Preliminary Examination Report and Written Opinion of the ISA for PCT/US2002/30677 dated Nov. 27, 2003; 10 pages.
PCT International Preliminary Examination Report and Written Opinion of the ISA for PCT/US2007/074795 dated Apr. 2, 2009; 7 pages.
PCT Search Report of the ISA for PCT/US2007/074795 dated Dec. 19, 2007; 5 pages.
PCT Written Opinion of the ISA for PCT/US2007/074795 dated Dec. 19, 2007; 5 pages.
Bash et al,; "Improving Heat Transfer From a Flip-Chip Package;" Technology Industry; Email Alert RSS Feed; Hewlett-Packard Journal, Aug. 1997; 3 pages.
Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.
Div. Application (with translation of amended claims) as filed on Dec. 1, 2008 in Korean Intellectual Property Office and assigned App. No. 10-2008-7029396.
Decision of Rejection dated Jul. 30, 2008 from KR Pat. App. No. 10-2004-7003900.
Notice of Trial Decision dated Mar. 23, 2010 from KR Pat. App. No. 10-2004-7003900.
EP Search Report for 06021905.2; dated Feb. 9, 2007; 8 pages.
European Office Action dated Nov. 3, 2005 from EP Pat. App. No. 02800372.1.
Response to European Office Action filed Jan. 12, 2007 from EP Pat. App. No. 02800372.1.
European Office Action dated Oct. 18, 2007 from EPO Pat. App. No. 06021905.2.
Response to European Office Action dated Oct. 18, 2007 filed in the EPO on Aug. 11, 2008 from EP Pat. App. No. 06021905.2.
Response to European Office Action dated Mar. 19, 2009 filed in the EPO on Nov. 19, 2009 from EP Pat. App. No. 06021905.2.
European Office Action dated Feb. 18, 2010 from EPO Pat. App. No. 06021905.2.
Notice of Allowance dated Feb. 2, 2007 from EP Pat. App. No. 02800372.1.
Korean Office Action dated Oct. 31, 2007 from KR Pat. App. No. 10-2004-7003900.
Response to Korean Office Action filed Mar. 26, 2008 from KR Pat. App. No. 10-2004-7003900.
Korean Office Action dated Feb. 25, 2009 from KR Pat. App. No. 10-2008-7029396.
Korean Office Action dated Nov. 27, 2009 from KR Pat. App. No. 10-2008-7029396.
Japanese Office Action dated Mar. 7, 2007 from JP Pat. App. No. 2003-533378.
Japanese Office Action dated Feb. 15, 2008 from JP Pat. App. No. 2003-533378.
Japanese Office Action dated Feb. 18, 2009 from JP Pat. App. No. 2003-533378.
Response to Japanese Office Action filed Jul. 5, 2007 from JP App. No. 2003-533378.
Response to Japanese Office Action filed Jun. 19, 2009 from App JP App. No. 2003-533378.
PCT Search Report of the ISA for PCT/US2010/026861 dated Jun. 18, 2010; 6 pages.
PCT Written Opinion of the ISA for PCT/US2010/026861 dated Jun. 18, 2010; 5 pages.
Office Action dated Jun. 11, 2010 from U.S. Appl. No. 12/694,450.
Response to Office Action of Jun. 11, 2010 from U.S. Appl. No. 12/694,450 dated Sep. 21, 2010.
Notice of Allowance dated Nov. 3, 2010 from U.S. Appl. No. 12/482,061.
Office Action dated Mar. 23, 2011 from U.S. Appl. No. 12/694,450.
International Preliminary Report on Patentability of the ISA for PCT/US2010/026861 dated Oct. 6, 2011.
Response to Office Action of Dec. 1, 2010 from U.S. Appl. No. 12/694,450 dated Jan. 25, 2011.
PCT Search Report of the ISA for PCT/US2010/049261 dated Feb. 7, 2011.
Written Opinion of the ISA for PCT/US2010/049261 dated Feb. 7, 2011.

* cited by examiner

HEAT SINK INTERFACE HAVING THREE-DIMENSIONAL TOLERANCE COMPENSATION

CROSS-REFERENCE TO RELATED APPLICATIONS

Not applicable.

FIELD OF THE INVENTION

The structures and techniques described herein relate to thermal management and more particularly to a thermal interface.

BACKGROUND OF THE INVENTION

As is known in the art, a phased array antenna includes a plurality of antenna elements spaced apart from each other by known distances. Each of the antenna elements are typically coupled through a plurality of phase shifter circuits, amplifier circuits and/or other circuits to either or both of a transmitter or receiver. In some cases, the phase shifter, amplifier circuits and other circuits (e.g. mixer circuits) are provided in a so-called transmit/receive (T/R) module and are considered to be part of the transmitter and/or receiver.

The phase shifters, amplifier and other radio frequency (RF) circuits (e.g. T/R modules) are often powered by an external power supply (e.g. a DC power supply). Such circuits are referred to as "active circuits" or "active components." Accordingly, phased array antennas which include active circuits are often referred to as "active phased arrays."

Active circuits dissipate power in the form of heat. Thus, it is necessary to cool active phased arrays so that the active circuits operate within a desired temperature range.

In active phased arrays having T/R channels which use relatively little power (e.g. less than about two Watts (W) average RF power), individual finned heat-sinks (or "hat-sinks") are sometimes attached to each active circuit in the channels. That is, each active circuit has an individual heat sink attached thereto. Although this approach may satisfy the cooling requirements for the active phased array, this approach to thermal management is expensive since the cost of disposing an individual "hat-sink" on an active circuit can be on the same order as the cost of the active circuit itself.

In relatively high power per T/R channel applications, it is often necessary to use a liquid cooling approach to maintain active circuits in their normal operating temperature range. Although the liquid cooling approach is effective to maintain active circuits at temperatures at or below maximum allowed operating temperatures, liquid cooling has very high life cycle costs. For example, liquid cooling requires the use of a manifold through which the liquid circulates. Such liquid filled manifolds add a tremendous amount of weight and complexity to a radar system which increases the radar system recurring cost and also increases the transportation costs and maintenance costs over the operational life of the active phased array.

The mechanical/thermal interfaces between the heat generating devices (e.g. the active circuits) and heat sinking devices determines, at least in part, the cooling effectiveness of heat sinking devices.

Some RF systems, including active phased arrays, utilize so-called flip-chip mounted circuits. One technique commonly used to remove heat from flip-chip mounted circuits (or more simply, "flip-chips") is to dispose a gap-pad between the exposed surface of the flip-chip and a surface of a heat sink. In this configuration, the gap-pad needs to be compliant in compression and shear to compensate for coplanarity tolerances from chip-to-chip and in-plane movement due to coefficient of thermal expansion (CTE) mismatch between the flip-chip, circuit board and heatsink as well as vibration between the circuit board on which the flip-chip circuit is mounted and the heatsink. The gap-pad technique can result in a thermal path having poor bulk thermal conductivity. Furthermore, the gap-pad approach results in thermal junctions on each surface of the gap pad (i.e. one thermal junction between the gap-pad and the chip and one thermal junction between the gap-pad and the heatsink). Such thermal junctions would not exist if the heatsink were directly mounted to the flip-chip. Furthermore, the thermal resistance at these junctions is relatively high compared with the thermal resistance which would result if the heatsink were directly mounted to the flip-chip.

It would, therefore, be desirable to provide a reliable, efficient and cost effective system and technique for cooling RF systems including active phased arrays which operate over a wide range of RF output power levels.

SUMMARY OF THE INVENTION

In accordance with the concepts and techniques described herein, it has been recognized that in an active panel array it is possible to provide a dielectric panel (or more simply a "panel") having an array of antenna elements disposed on one surface and having a plurality of active circuits disposed on a second opposing surface of the panel. In preferred embodiments, the active circuits are flip-chip mounted to the panel surface. Such panels are typically provided by bonding together multiple circuit boards. In applications in which the panel is relatively large, the panel has a flatness tolerance which must be taken into account when mounting a heat sink to the flip-chip mounted circuits.

To compensate for such flatness tolerance, a gap-pad can be utilized between the flip-chip mounted circuit and the heat sink. The RF power level achievable using such a cooling method is limited due to relatively high temperature rises which occur through thermal interfaces between the gap-pad and the flip-chip and the gap-pad and the heatsink, as well as through the bulk of the gap-pad material.

Another technique which can be used is to couple a thermal strap between each active circuit and the heatsink. The thermal strap technique is often used for individual flip-chips because thermal straps generally cannot compensate for 3-dimensional Coefficient of Thermal Expansion (CTE) mismatch.

In accordance with the concepts, structures and techniques described herein, a thermal interface includes a frame having a plurality of elevated regions and a plurality of mechanical tolerance circuits which couple the plurality of elevated regions to the frame. The thermal interface is configured to be disposed between an array of heat generating elements and a heat sink with each of the plurality of elevated regions thermally coupled to a corresponding one or more of the array of heat generating elements. In one embodiment, the thermal interface is disposed between a printed wiring board having a plurality of flip-chip circuit components disposed on an external surface thereof and a heat sink disposed over the flip-chip circuit components.

The mechanical tolerance circuit portions of the thermal interface allow the thermal interface to be mechanically coupled to both the flip-chip and the heatsink using a coupling having a low thermal resistance (e.g. a solder joint, thermally conductive epoxies, thermal grease, phase change compounds or the like). The thermal interface thus significantly improves the heat transfer between the flip-chip and the heatsink because the thermal interface allows use of a connection (e.g. direct solder attachment) having a thermal resistance which is on the order of the thermal resistance which would result if the heatsink were directly coupled to the flip-chip. A reason a direct solder attachment can be used is because three-dimensional tolerance compensation is accomplished via the mechanical tolerance circuit portions of the thermal interface. In a preferred embodiment, the mechanical tolerance circuit portions are provided as strain relieving bends formed in the thermal interface. Also, the thermal interface can be provided from a high thermal conductivity ductile material, e.g. copper, so the temperature rise through the bulk of the material may be significantly less than the temperature rise through a gap-pad, for example.

In the thermal gap-pad technique, the gap-pad is used to compensate for variations in spacing between a heatsink surface and a heat generating device. Thus, different thicknesses at the thermal interface exist. That is, due to variations in flatness and thickness of a heat sink and circuit components, the gap-pad portion located at one circuit component (e.g. one chip) is typically compressed to a different thickness than the gap-pad portion located at another circuit component. As a result of such variations in thicknesses, the junction temperature at the flip-chips varies from one location to another. Such variations in thickness result in temperatures gradients across the array of active circuits.

When the active circuits and gap pad are used as part of a phased array antenna, the phased array antenna has temperature gradients and such temperature gradients adversely affect the performance of the phased array. When a phased array is used as part of a radar system (e.g. a phased array radar system), the radar system preferably takes into account the effects of the temperature gradients. Thus, temperature gradients can be a problem to solve in a phased array radar.

With the thermal interface approach described herein, however, the conduction distance from each circuit component (e.g. each flip-chip) to the heatsink is identical from one chip to another. Thus, the thermal interface provides a more uniform temperature distribution among circuit components (e.g. flip-chips) mounted on a panel, for example.

In one embodiment, the thermal interface is configured for operation with a radio frequency (RF) panel array. RF panel arrays require new and innovative cooling solutions because their thermal requirements are unique compared with existing thermal requirements encountered in conventional phased arrays.

In conventional phased arrays, processors are typically cooled one chip at a time. Thus, multiple processors on a circuit card require multiple gap-pads or many thermal straps because neither one (i.e. neither a gap-pad nor a thermal strap) can compensate for the three-dimensional aspects of an array of chips, such as those found in panel array applications.

The thermal interface described herein not only compensates for tolerance stackup and dynamic strain due to coefficient of thermal expansion mismatch, but also provides a superior thermal path resulting in lower junction temperatures at chip and heatsink interfaces as well as higher performance and reliability.

BRIEF DESCRIPTION OF THE DRAWINGS

The foregoing features of this invention, as well as the invention itself, may be more fully understood from the following description of the drawings in which.

Figure 1:
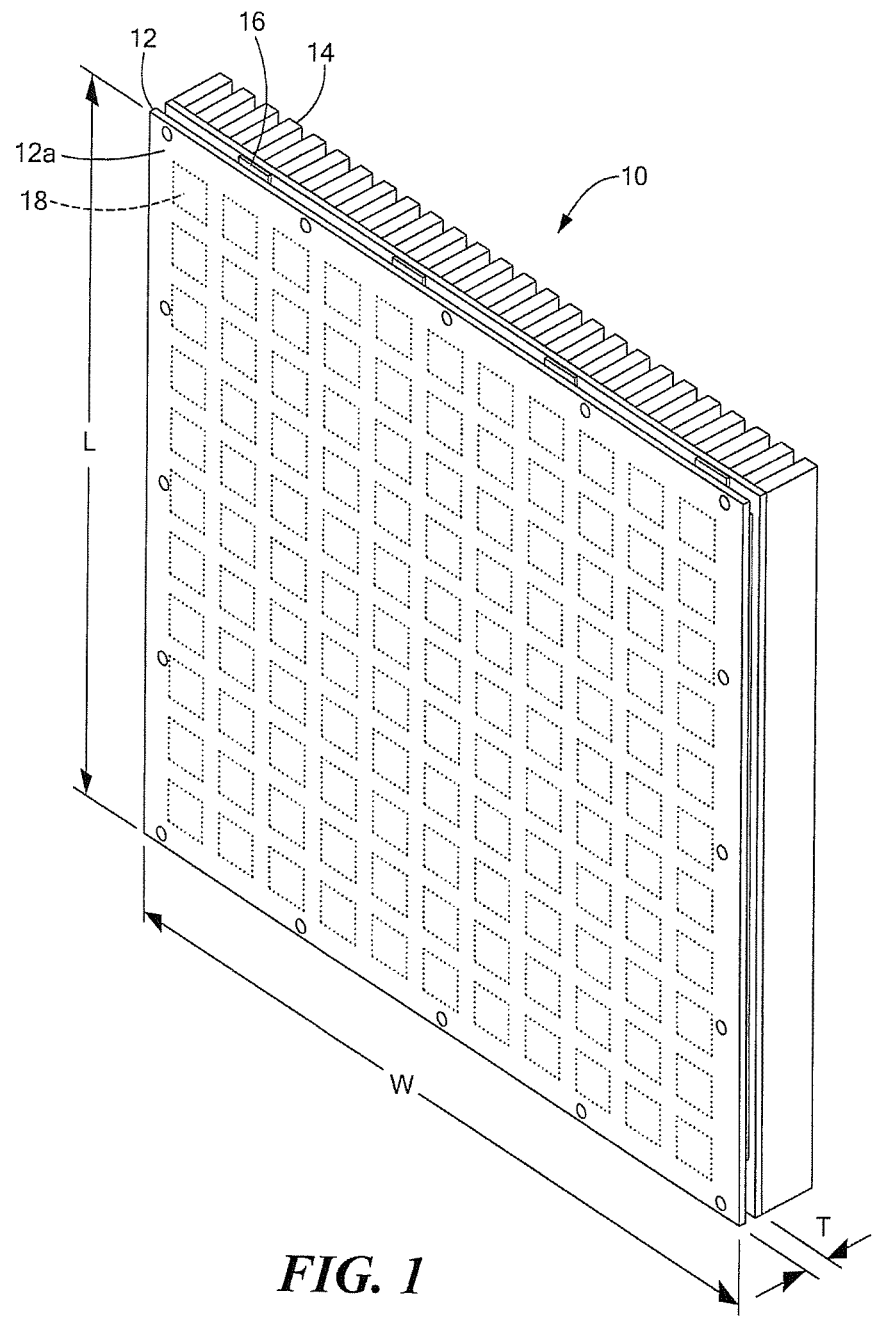
FIG. 1 is an isometric view of an integrated heatsink-panel assembly provided from an active panel array having a thermal interface and heatsink coupled thereto.
Figure 2:
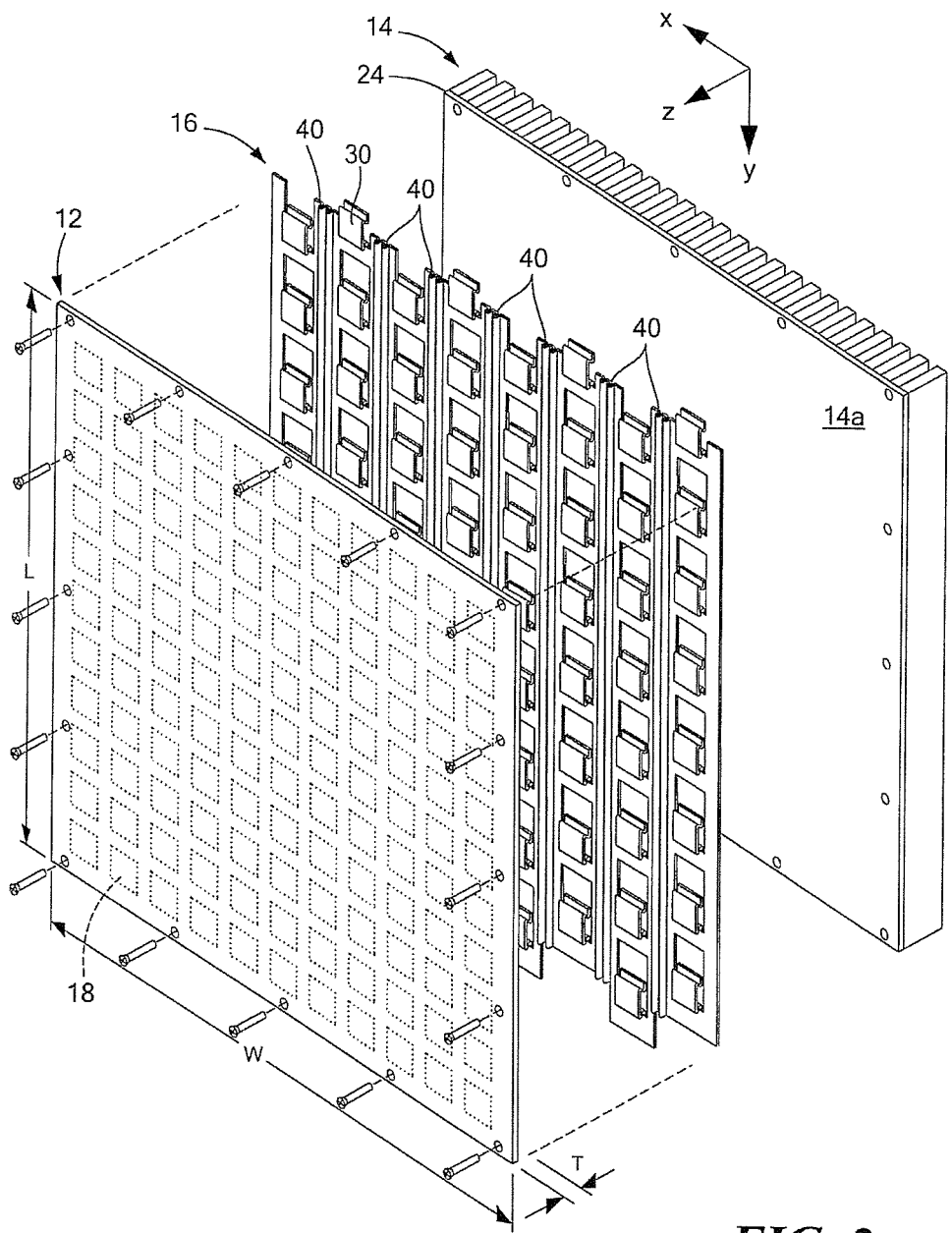
FIGS. 2 and 3 are exploded isometric views of the integrated heatsink-panel assembly shown in FIG. 1.
Figure 3:
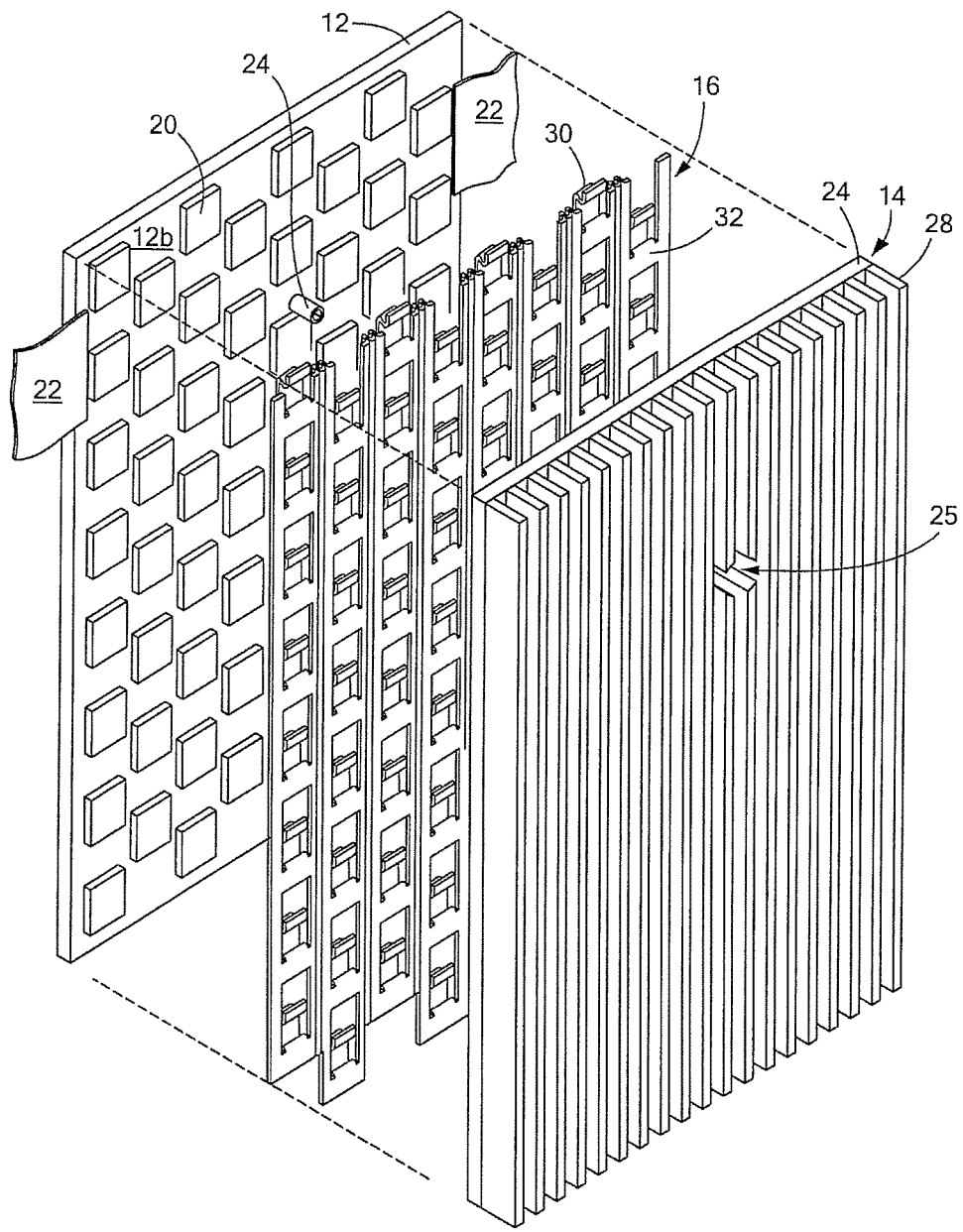

It should be understood that in an effort to promote clarity in the drawings and the text, the drawings are not necessarily to scale, emphasis instead is generally placed upon illustrating the principles of the invention.

DESCRIPTION OF THE PREFERRED EMBODIMENTS

Before describing the various embodiments of the invention, some introductory concepts and terminology are explained.

Described herein is a structure which acts as a mechanical and thermal interface between a heat generating device (e.g. a heat generating radio frequency circuit) and a heat sink. The interface compensates for mechanical tolerances in three dimensions. The interface is also sometimes referred to herein as a "thermal interface," a "thermal cushion," or a "heat sink interface."

The thermal interface is described herein in the context of an "active panel array" antenna. It should be appreciated, however, that the thermal interface and concepts described herein, may also be used with other heat generating devices and is not limited to use with active panel array antennas. Rather, the thermal interface and concepts can be used with any radio frequency (RF) circuit which utilizes a heat sink. The thermal interface may also find application with other types of circuits (e.g. non-RF circuits) which utilize a heat sink. In particular, the thermal interface structure and concept described herein can be used in any application in which mechanical or other tolerances of a heat generating structure and a heat sink promote use of an interface structure having low thermal resistance therebetween.

A "panel array antenna" (or "panel array" or more simply "panel") to be described herein refers to a multilayer printed wiring board (PWB) which includes an array of antenna elements (or more simply "radiating elements" or "radiators"), as well as RF, logic and DC distribution circuits in one highly integrated PWB. A panel is also sometimes referred to herein as a tile array (or more simply, a "tile"). A panel array antenna may be provided from a single panel or from a plurality of panels. In the case where an array antenna is provided from a plurality of panels, a single one of the plurality of panels is sometimes referred to herein as a "panel sub-array" (or a "tile sub-array").

A heat sink interface may be disposed over a single panel, multiple panels or over portions of one or more panels. Thus, the heat sink interface may be provided having a size and shape selected in accordance with the needs of the particular application in which it is being used.

Reference is also sometimes made herein to an array antenna having a particular number of panels or a particular number of heat sink interfaces. It should of course, be appreciated that an array antenna may be comprised of any number of panels and heat sink interfaces and that one of ordinary skill in the art will appreciate how to select the particular number of panels and heat sink interfaces to use in any particular application.

It should also be noted that reference is sometimes made herein to a panel or an array antenna having a particular array shape and/or physical size or a particular number of antenna elements and one or more heat sink interfaces having a particular shape and/or physical size. One of ordinary skill in the art will appreciate that the heat sink interfaces described herein are applicable to various sizes and shapes of panels or other structures and that any number of heat sink interfaces may be used in a given application.

Thus, although the description provided hereinbelow describes a thermal interface and related concepts in the context of an array antenna having a substantially square or rectangular shape, those of ordinary skill in the art will appreciate that the concepts equally apply to other sizes and shapes of antennas or other circuits having a variety of different sizes and shapes.

Applications of at least some embodiments of the thermal interface described herein include, but are not limited to, radar, electronic warfare (EW) and communication systems for a wide variety of applications including ship based, airborne, missile and satellite applications. It should thus be appreciated that the thermal interface described herein can be used as part of a radar system or a communications system.

As will also be explained further herein, at least some embodiments of the invention are applicable, but not limited to, commercial, military, airborne, shipborne, communications, unmanned aerial vehicles (UAV) and/or commercial wireless applications.

The panel to be described hereinbelow can also utilize embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States patents can be used in whole or in part and/or adapted to be used with at least some embodiments of the panel (aka tile subarrays) described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multilayer stripline radio frequency circuits and interconnection methods." Each of the above patents is hereby incorporated herein by reference in their entireties.

Referring now to FIGS. 1-5 in which like elements are provided having like reference designations throughout the several views, an exemplary active, electronically scanned array (AESA) having a panel architecture includes an integrated heatsink-panel assembly denoted 10. Panel assembly 10 includes a panel array 12 having a heatsink 14 coupled thereto. A thermal interface 16 is disposed between panel array 12 and heatsink 14. As will become apparent from the description hereinbelow, thermal interface 16 provides a mechanical and thermal interface between heat sink 14 and heat generating circuits 20 (FIG. 3) disposed on panel array 12.

In one embodiment, panel 12 is provided from a polytetrafluoroethylene (PTFE) multilayer PWB comprised of a plurality of individual circuit boards bonded or otherwise joined together to provide the multilayer PWB. Panel 12 has a thickness T and is generally planar and has a plurality of antenna elements, generally denoted 18 disposed to radiate through a first surface 12a thereof. Antenna elements 18 are shown in phantom since they are provided on a circuit board layer which is located below the circuit board layer which corresponds to surface 12a.

The multilayer PWB which comprises panel 12 includes RF, power and logic circuits and in a preferred embodiment is provided from a single lamination and single drill and plate operations. The single lamination and single drill and plate operations result in a low-cost, low profile (i.e. thin) panel. Thus the PWB from which panel 12 is provided is a low cost mixed signal PWB.

All active and passive electronics, generally denoted 20 (FIG. 3), are disposed on a second surface 12b (FIG. 3) of panel 12. In one embodiment, electronics 20 are provided as monolithic microwave integrated circuits (MMIC) mounted on surface 12b using a so-called "flip-chip" mounting technique. Thus, electronics 20 are sometimes referred to herein as flip-chip circuits or more simply "flip-chips."

It should be appreciated that in one embodiment, components 20 are provided as surface mount components and that a metal cover (not shown) is bonded over components 20 and an environmental conformal coating is then applied. One or more "flex" circuits 22 (FIG. 3) are coupled to panel 12 and to components 20. Use of embedded "flex" circuits 22 for DC and logic signals eliminates the expense of DC, logic connector material and assembly cost. Also coupled to panel 12 are one or more RF connectors 24 (only one RF connector being shown in FIG. 3 to promote clarity in the drawing and description).

Heat sink 14 comprises a base portion 24 having a first surface corresponding to surface 14a of heat sink 14 and a second opposing surface having a plurality of heat spreading elements 28 projecting therefrom. In the exemplary embodiment shown in FIGS. 1-3, heat spreading elements 28 are shown as fins, but any type of heat spreading element may be used including but not limited to pins or any other structure known to those of ordinary skill in the art. Heat sink 14 has an opening 25 provided therein through which RF connector 24 is disposed (FIG. 3) when panel 12, interface 16 and heat sink 14 are assembled to provide integrated heatsink-panel assembly 10.

Thermal interface 16 has a plurality of raised surfaces 30 with each of the raised surfaces disposed to contact surfaces of corresponding ones of electronics 20. Although each surface 30 is here shown to contact only a single component 20, in some embodiments it may be preferable to provide one or more of surfaces 30 having a size and shape such that they contact more than one component 20.

A second surface 32 of interface 16 is disposed to contact surface 14a of heat sink 14. Thermal interface 16 may be provided from a thermally conductive material (e.g. a thermally conductivity ductile material such as copper, for example) or may be provided from a non-thermally conductive material and have a thermally conductive coating disposed thereover. In either case, interface 16 provides a thermally conductive path between electronics 20 and heat sink surface 14a. Thus, surface 14a of heat sink 14 is thermally coupled to heat generating devices (e.g. electronics 20) on surface 12b of panel 12.

In a preferred embodiment, a bond exists between heat sink surface 14a and surface 32 of thermal interface 16. Thus, surface 14a of heat sink 14 is disposed over and configured to be in thermal contact with surface 32 of interface 16.

Figure 4:
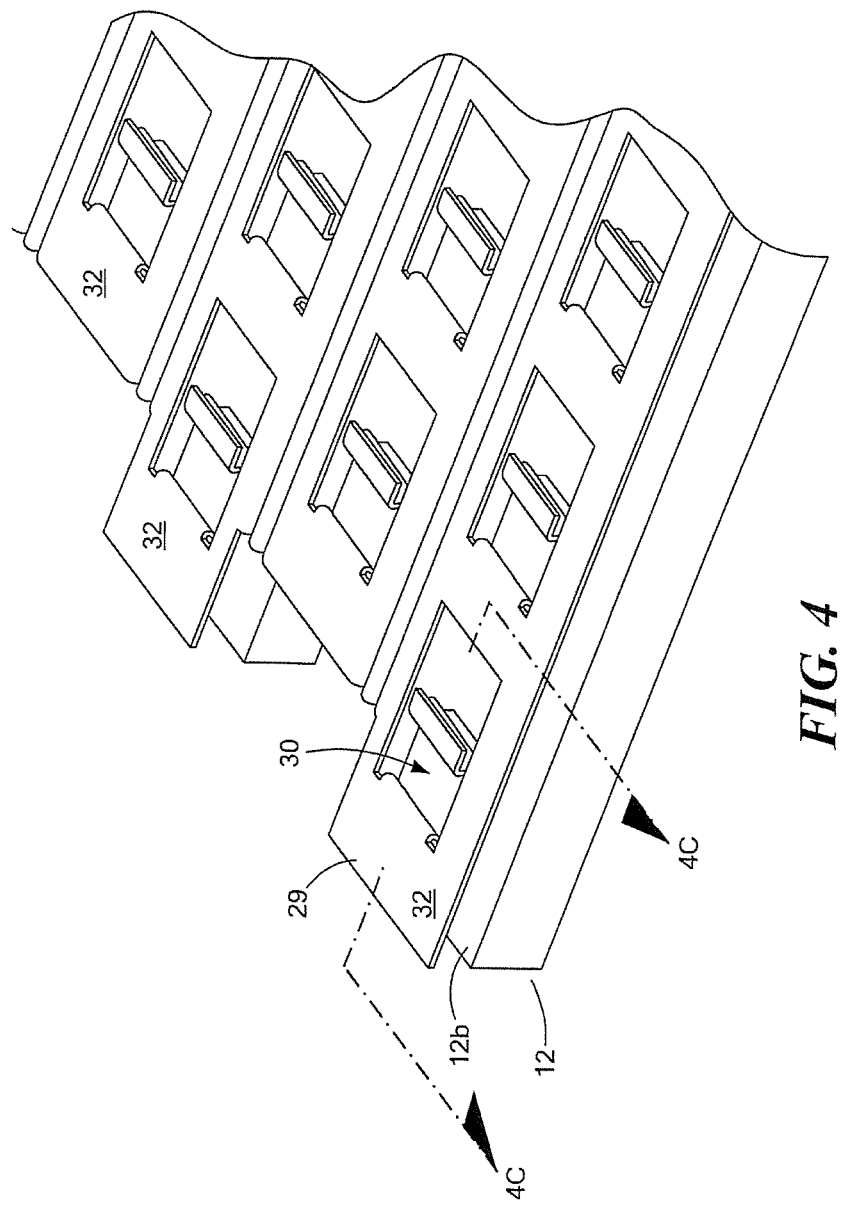
FIGS. 4, 4A and 4B are perspective views of a portion of the integrated heatsink-panel assembly shown in FIGS. 1-3.
Figure 4A:
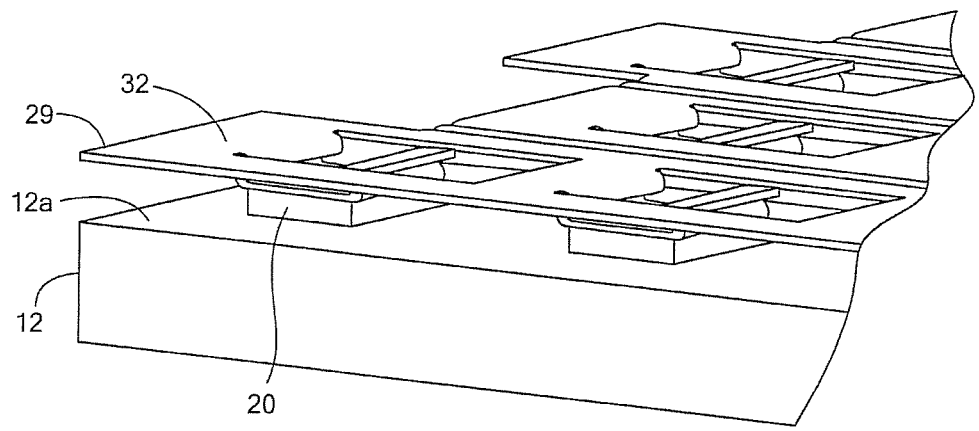
Figure 4B:
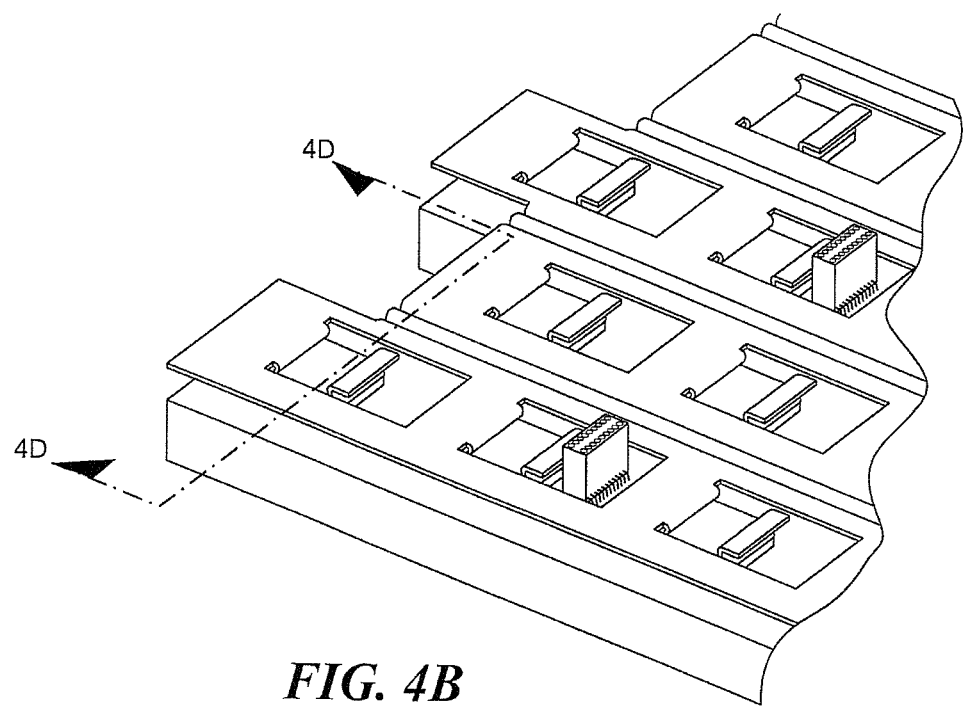

Also in a preferred embodiment, thermal interface sections 30 are directly bonded to electronics 20 (FIG. 4A). Electronics 20 may correspond to either or both passive and active circuits disposed on or exposed through a surface of a PWB (e.g. PWB 12 shown in FIG. 4A).

Figure 4C:
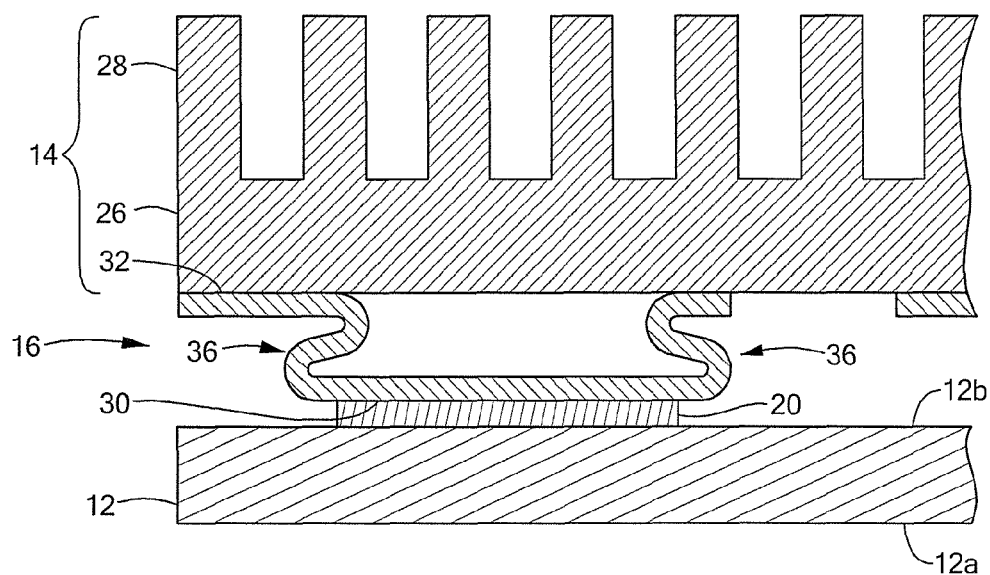
FIG. 4C is a cross-sectional view of the integrated heatsink-panel taken across lines 4C-4C in FIG. 4.
Figure 4D:
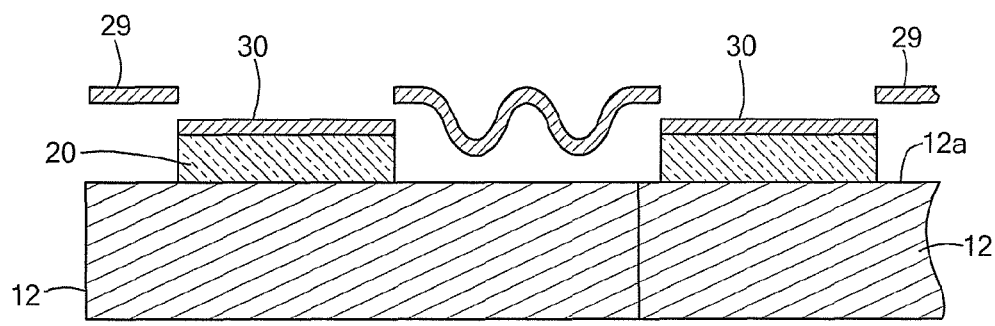
FIG. 4D is a cross-sectional view of the integrated heatsink-panel taken across lines 4D-4D in FIG. 4B.

Practical multilayer PWBs (and in particular, multilayer PWBs provided from multiple circuit boards) have flatness tolerances which make it difficult to achieve good thermal contact between multiple circuits (e.g. components 20) disposed on the PWB and a heat sink (e.g. heat sink 14) Thus, referring to FIGS. 4-4D. thermal interface 16 is provided having a base portion or frame 29 from which sections 30 project to provide sections 30 as a plurality of elevated regions 30 (elevated in the sense that surfaces of regions 30 are in a plane which is substantially parallel to but different than a plane in which a surface of frame 29 lies). Each of the elevated regions 30 are coupled to frame 29 via a structure 36 (most clearly visible in FIG. 4C) having a shape selected such that the structure acts as a mechanical tolerance circuit 36 coupled between frame 29 and elevated region 30. Mechanical tolerance circuit 36 primarily provides tolerance compensation in the Z-direction.

Thus, thermal interface 16 is configured to be disposed between an array of heat generating elements (e.g. elements 20) and a heat sink (e.g. heat sink 14) with each of the plurality of elevated regions 30 thermally coupled to a corresponding one or more of the array of heat generating elements. In one embodiment, the thermal interface promotes transfer of heat from a printed wiring board having a plurality of flip-chip circuit components disposed on an external surface thereof and a heat sink disposed over the flip-chip mounted circuit components.

The mechanical tolerance circuit portions 36 (FIG. 4C) of thermal interface 16 allows the thermal interface to be coupled between an array of flip-chips and a heatsink using a technique having a low thermal resistance (e.g. a solder joint, thermally conductive epoxies, and/or thermal greases or phase change compounds). The reason a direct solder attachment can be used is because three-dimensional tolerance compensation is accomplished via the mechanical tolerance circuit portions 36 of thermal interface 16. In a preferred embodiment, the mechanical tolerance circuit portions 36 are provided as strain relieving bends. In the embodiment shown in FIG. 4C, the strain relieving bends are provided having an S-shape (also sometimes referred to herein as a double C-shape). As will become apparent from the description hereinbelow, other shapes may also be used including but not limited to an accordion shape, a corrugated shape or a spiral shape.

Also, as mentioned above, the thermal interface can be made from high thermal conductivity ductile material (e.g. copper) or a ductile material having a thermally conductive coating disposed thereon. Thus, the temperature rise through the bulk of the thermal interface material may be significantly less than the temperature rise through a gap-pad (i.e. the differential of the temperature at the first interface where the chip and the gap-pad/thermal interface material meet and the temperature at the second interface where the heatsink and the gap-pad/thermal interface material meet).

Furthermore, thermal interface 16 controls temperature gradients among active circuits. This is typically a difficult and important problem to solve in phased array radar applications, for example, since temperature gradients can directly affect the operation of the radar. Also, it is relatively time consuming to compensate for such temperature gradients in a phased array radar.

Although a prior art thermal gap-pad can be used to compensate for various thicknesses at the thermal interface, since one pad portion gets compressed to a different thickness than a pad portion at another chip, the junction temperature varies from one to another.

With the thermal interface approach, however, the conduction distance as measured from the chip to the heatsink is identical from one chip to another and thus provides a more uniform temperature distribution.

Furthermore, the use of a solder connection or other low-thermal resistance connection between the heat generating circuits and the thermal interface and the thermal interface and the heat sink reduces the thermal resistance between heat generating circuits and the heat sink. By reducing the thermal resistance between the heat sink and the heat generating circuits, the heat is removed from the circuits more efficiently than with prior art gap-pad approaches. Thus, the panel-interface-heat sink arrangement described herein efficiently transfers heat (i.e. thermal energy) from an active panel (and in particular from active circuits mounted on the active panel) to the heat sink.

Furthermore, thermal interface 16 allows a single heat sink to cool multiple flip-chip mounted circuits (vs. the prior art use of multiple, individual "hat sinks"). Thus, the cost (both part cost and assembly costs) of cooling a panel array or other circuit is reduced since it is not necessary to mount individual heat sinks on each heat generating circuit.

As mentioned above, in one embodiment, the flip-chip circuits are provided as monolithic microwave integrated circuits (MMICs) and the heat sink heat spreading elements are provided as fins or pins. In other embodiments, liquid cooled heatsinks (e.g. brazements, etc.) may be used.

In one embodiment, the heat sink may be provided as an aluminum finned heat sink having a mechanical interface between a surface thereof and a plurality of flip-chip MMICs disposed on a surface of the panel.

Figure 5:
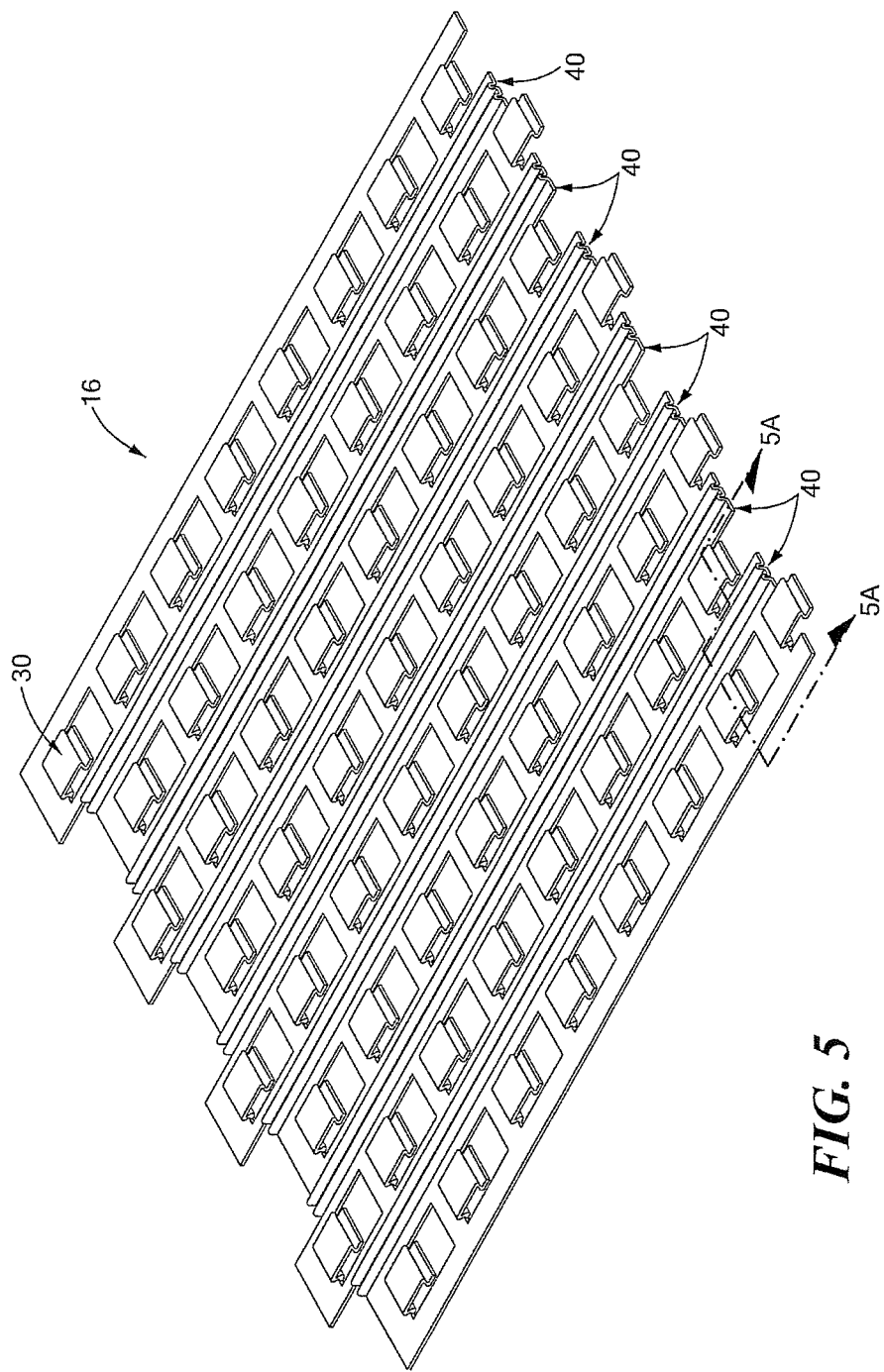
FIG. 5 is a perspective view of a thermal interface of the type which may be used in the integrated heatsink-panel assembly shown in FIGS. 1-3.
Figure 5A:
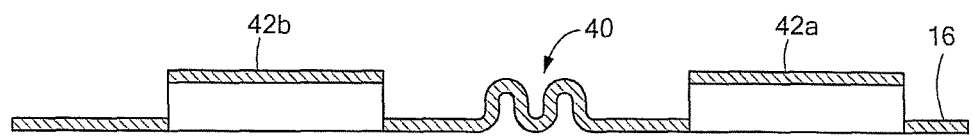
FIG. 5A is a cross-sectional view of a portion of the thermal interface shown in FIG. 5 taken across lines 5A-5A in FIG. 5.

Referring now to FIGS. 5 and 5A, interface 16 also includes a plurality of strain relieved sections 40 (most clearly seen in FIG. 5A) which allow relative movement between different regions of frame 29 and also between regions of frame 29 and elevated regions 30 (i.e. movement in the x-y plane). Strain relieved sections 40 accommodate movement in one direction. The other direction is accommodated by "rocking" of the raised section. In the embodiment of FIG. 5A, raised sections 30a, 30b on which heat generating components will be disposed, are disposed on opposite sides of strain relieved sections 40 which are provided as bends in frame 29. In the particular embodiment of FIG. 5A, strain relieved section 40 is provided from S-shaped and C-shaped bends in frame 29. Strain relieved section 40 may of course also be provided having other shapes including but not limited to an accordion shape, a corrugated shape, or a spiral shape.

Figure 6:
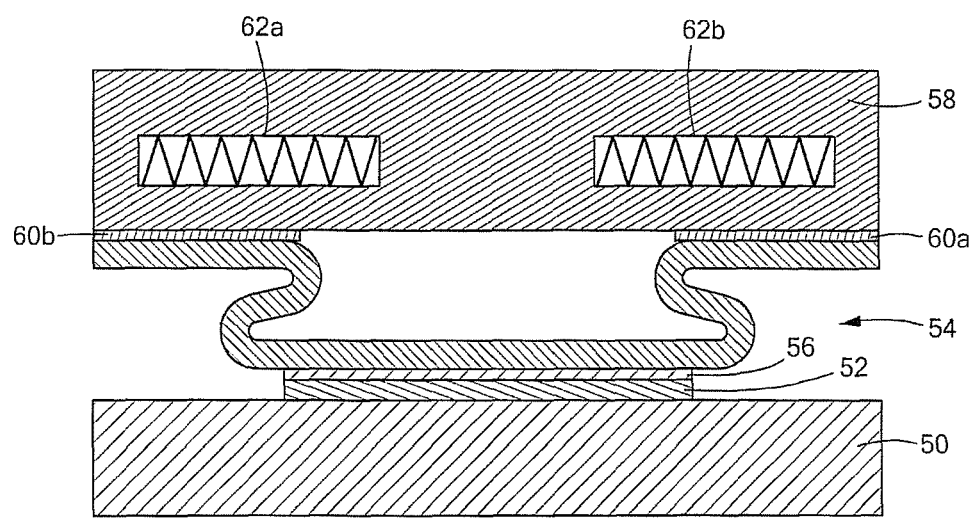
FIG. 6 is an enlarged cross-sectional view of a printed circuit board thermally coupled to a heat sink by a thermal interface.

Referring now to FIG. 6, a PWB 50 has a heat generating device 52 disposed on a surface thereof. An interface 54 has a first portion coupled to device 52 via a solder connection 56. It should, of course, be appreciated that other thermal interface materials could be used (e.g. thermally conductive epoxy, thermal grease, phase change materials, gap-pads, etc. may also be used). A second portion of interface 54 is coupled to a heat sink 58 via solder joints 60a, 60b.

Interface 54 is provided having a pair of generally S-shaped legs or paths which lead from heat sink 58 to device 52. The S-shaped paths allow relative movement between heat sink 58 and device 52 in multiple directions. Thus, S-shaped paths act as mechanical tolerance circuits which accommodate mechanical tolerances which occur in the manufacture and/or assembly of the PWB 50, device 52, and heat sink 58.

Figure 7:
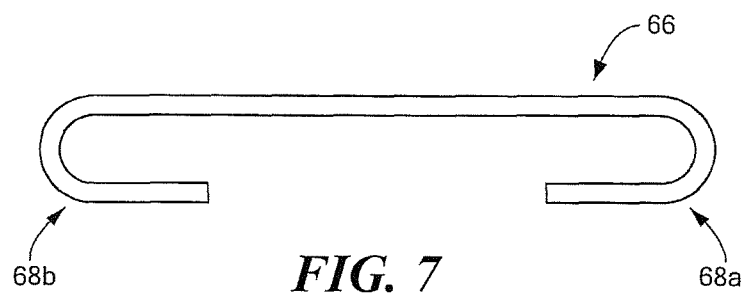
FIGS. 7-7B are a series of side views of structures which can be used in a thermal interface to provide mechanical tolerance compensation.

Referring now to FIG. 7, an interface 66 includes a pair of tolerance circuits implemented as C-shape bends 68a, 68b. This interface embodiment would be appropriate for applications having relatively small tolerances which need be accommodated or applications having high compression forces to accommodate the tolerance.

Figure 7A:
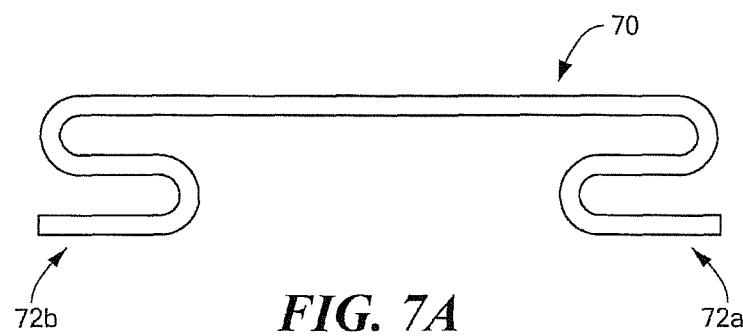

Referring now to FIG. 7A, an interface 70 includes tolerance circuits implemented as a pair of S-shape bends 72a, 72b. This interface embodiment would be appropriate for applications having moderately large tolerances which need be accommodated or applications having moderate compression forces to accommodate the tolerance.

Figure 7B:
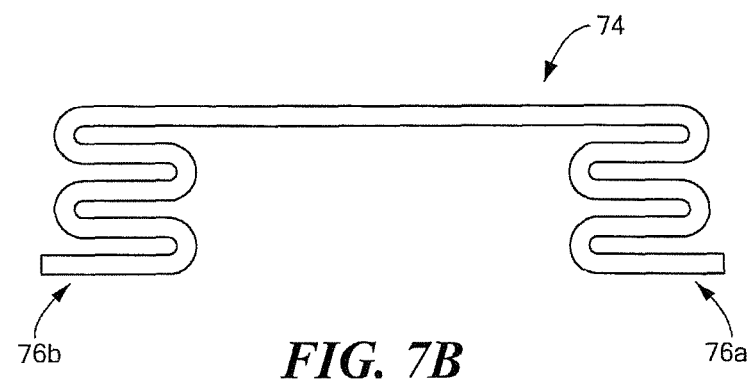

Referring now to FIG. 7B, an interface 74 includes mechanical tolerance circuits implemented as a pair of double-S-shape bends 76a, 76b. This interface embodiment would be appropriate for applications having relatively large tolerances which need be accommodated or applications having low compression forces to accommodate the tolerance.

In general the larger the number of bends in the interface leg (e.g. mechanical tolerance circuits 36 or strain relieved sections 40), the larger the tolerances which can be accommodated or the lower the force required to accommodate the tolerance. One of ordinary skill in the art would know how to configure the bends for a desired application.

Figure 8:
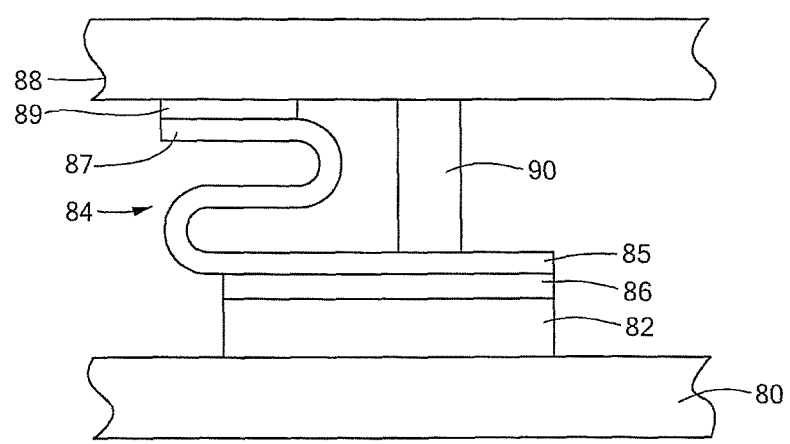
FIG. 8 is a side view of a printed circuit board thermally coupled to a heat sink by a thermal interface with a force providing structure disposed to provide a force which mechanically couples the thermal interface to a heat generating device.

Referring now to FIG. 8, a PWB 80 has a heat generating device 82 (e.g. an integrated circuit or chip) disposed on a surface thereof. An interface 84 has a first portion 85 coupled to device 82 via an optional thermal interface 86 (which may, for example, be provided as a solder connection 86, a thermal grease, a thermal epoxy or a phase change compound 86). A second portion 87 of interface 82 is coupled to a heat sink 88 through an interface 89 (which may, for example, be provided as a solder connection 89, a thermal grease, a thermal epoxy or a phase change compound 89). A force providing structure 90 is disposed to provide a force which mechanically couples thermal interface surface 84 and a surface of heat sink 88. The force providing structure 90 allows for a dry, non-permanent (e.g. easily removable) interface at the heat generating device 82 (hence interface 86 is optional). Compression force is needed in order for a dry interface to work as a good thermal interface.

Interface 84 is provided having a single S-shaped leg or path which leads from heat sink 88 to device 82. The S-shaped path allows relative movement between heat sink 88 and device 82 in multiple directions. Thus, the single S-shaped path acts as a tolerance circuit which accommodates tolerances which occur in the manufacture and/or assembly of the PWB 80, device 82, and heat sink 88.

Figure 9:
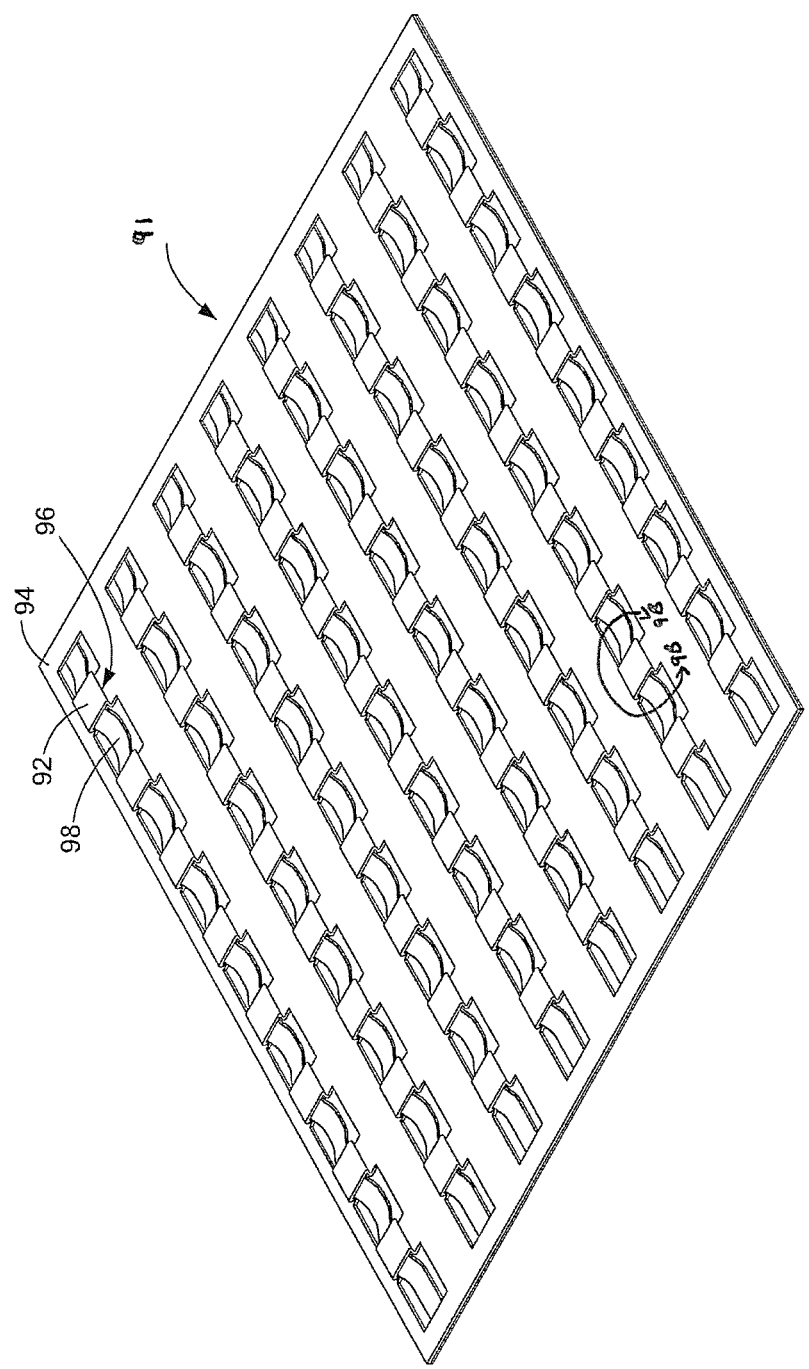
FIG. 9 is a perspective view of the thermal interface coupled to an exemplary force providing structure.
Figure 9A:
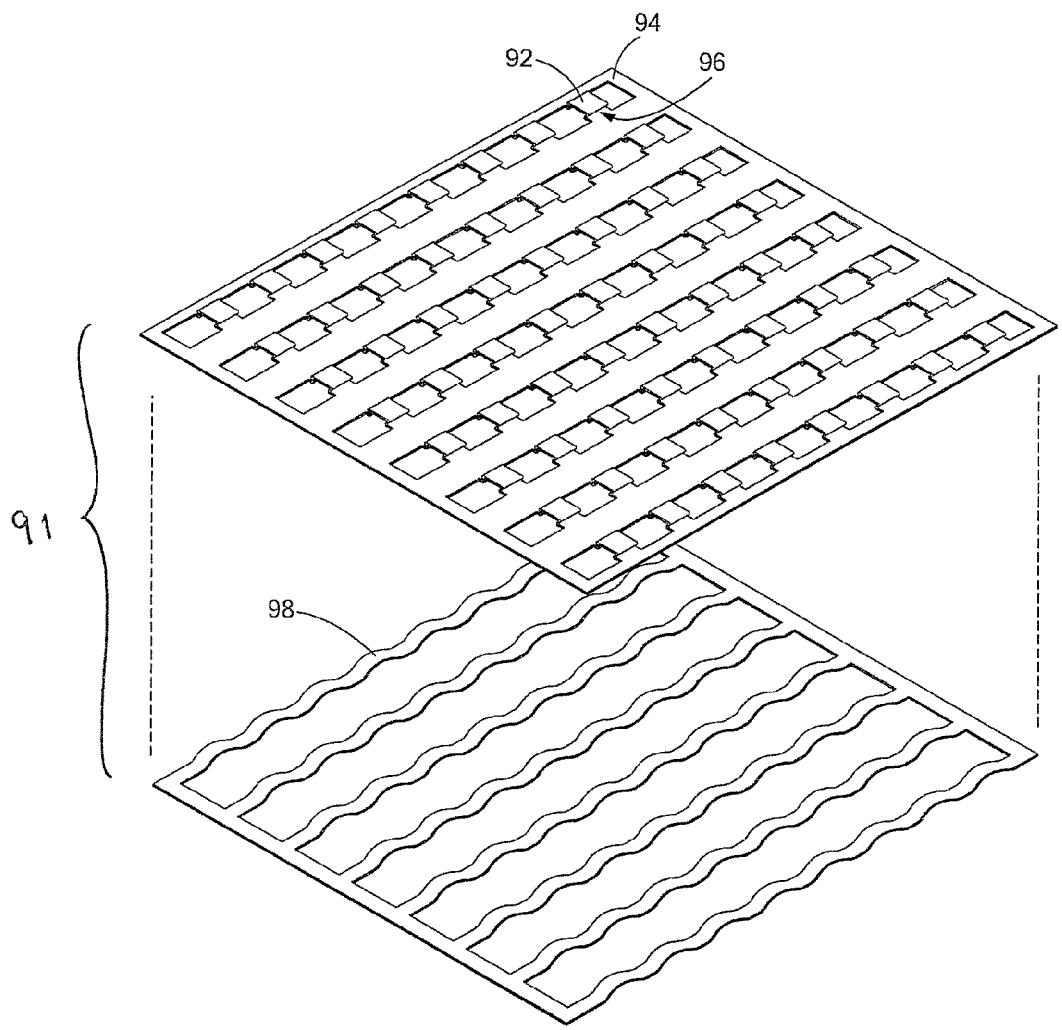
FIG. 9A is an exploded view of the thermal interface of FIG. 9.
Figure 9B:
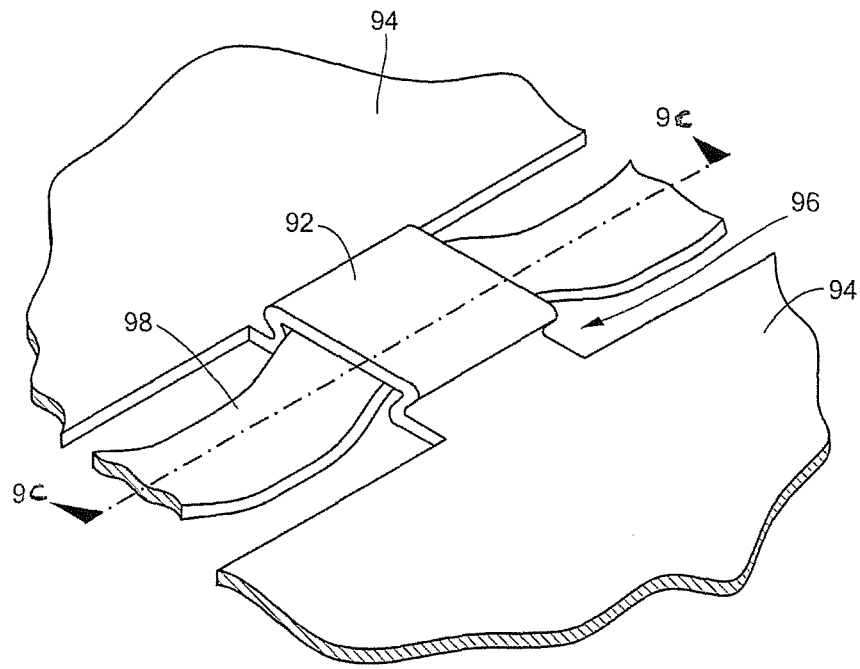
FIG. 9B is an enlarged perspective view of a portion of the thermal interface and force providing structure taken across lines 9B-9B in FIG. 9.
Figure 9C:
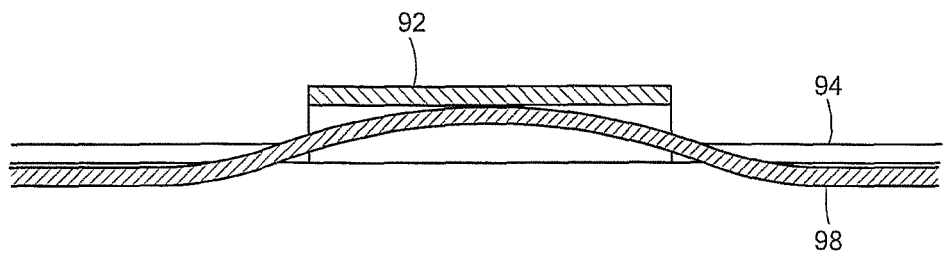
FIG. 9C is a cross-sectional view of a portion of the thermal interface taken across lines 9B-9B in FIG. 9B.

Referring now to FIGS. 9-9C, an interface 91 includes a plurality of raised regions 92 coupled to a frame 94 via tolerance circuit 96. Structural ribbons 98 are disposed through raised regions 92 to provide interface 91 with a warp-weave type of pattern. The structural ribbon 98 (e.g. leaf spring) acts as the a force providing mechanism (e.g. force providing mechanism 90 in FIG. 8). Thus, structure 91 can utilize a "dry" interface (e.g. between a heat generating device and the thermal interface) as described above in conjunction with FIG. 8. With this technique, a heatsink is relatively easy to remove from a heat generating device since it is not necessary to engage in steps such as solder reflow or cleaning or thermal epoxy or thermal grease or others steps or processes well-know to those of ordinary skill in the art.

All publications and references cited herein are expressly incorporated herein by reference in their entirety.

In the figures of this application, in some instances, a plurality of elements may be shown as illustrative of a particular element, and a single element may be shown as illustrative of a plurality of a particular elements. Showing a plurality of a particular element is not intended to imply that a system or method implemented in accordance with the invention must comprise more than one of that element or step, nor is it intended by illustrating a single element that the invention is limited to embodiments having only a single one of that respective element. Those skilled in the art will recognize that the numbers of a particular element shown in a drawing can, in at least some instances, be selected to accommodate the particular user needs.

It is intended that the particular combinations of elements and features in the above-detailed embodiments be considered exemplary only; the interchanging and substitution of these teachings with other teachings in this and the incorporated-by-reference patents and applications are also expressly contemplated. As those of ordinary skill in the art will recognize, variations, modifications, and other implementations of what is described herein can occur to those of ordinary skill in the art without departing from the spirit and scope of the concepts as described and claimed herein. Thus, the foregoing description is by way of example only and is not intended to be and should not be construed in any way to be limiting.

Further, in describing the invention and in illustrating embodiments of the concepts in the figures, specific terminology, numbers, dimensions, materials, etc., are used for the sake of clarity. However the concepts are not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Having described the preferred embodiments of the concepts sought to be protected, it will now become apparent to one of ordinary skill in the art that other embodiments incorporating the concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. Variations, modifications, and other implementations of what is described herein can occur to those of ordinary skill in the art without departing from the spirit and the scope of the concepts as described and claimed. It is felt, therefore, that the scope of protection should not be limited to or by the disclosed embodiments, but rather, should be limited only by the spirit and scope of the appended claims.

What is claimed is:

1. A thermal interface comprising:
   a frame having first and second opposing surfaces;
   a plurality of elevated regions projecting above one of the first and second opposing surfaces of said frame;
   a force providing element coupled to the thermal interface such that said force providing element provides a force to the elevated regions by being disposed through the elevated regions to provide the thermal interface with a warp-weave type pattern;
   a plurality of mechanical tolerance circuits, each of said mechanical tolerance circuits coupled between at least one of said plurality of elevated regions and said frame.

2. The thermal interface of claim 1 wherein the plurality of elevated regions and plurality of mechanical tolerance circuits are provided as like pluralities and each of said mechanical tolerance circuits are coupled between a corresponding one of said plurality of elevated regions and said frame.

3. The thermal interface of claim 1 wherein a first one of the mechanical tolerance circuits is provided having a single generally C-shape.

4. The thermal interface of claim 1 wherein a first one of the mechanical tolerance circuits is provided having a generally S-shape.

5. The thermal interface of claim 1 wherein a first one of the mechanical tolerance circuits is provided having a generally triple C-shape.

6. The thermal interface of claim 1, further comprising a plurality of strain relieved sections comprising members having one or more C-shaped bends to accommodate movement in one direction and extending between at least some of said plurality of elevated regions.

7. The thermal interface of claim 6 wherein the plurality of strain relieved sections is provided in said frame.

8. The thermal interface of claim 6 wherein the members further comprise one or more S-shaped bends to accommodate movement in one direction.

9. A system comprising:
   an array of heat generating elements;
   a thermal interface comprising:
      a plurality of elevated regions;
      a force providing element coupled to the thermal interface such that said force providing element provides a force to the elevated regions by being disposed through the elevated regions to provide the thermal interface with a warp-weave type pattern;
      a plurality of mechanical tolerance circuits coupled to the plurality of elevated regions with each of the plurality of elevated regions thermally coupled to a corresponding one or more of the array of heat generating elements; and
   a heat sink coupled to said thermal interface such that said thermal interface is disposed between said array of heat generating elements and said heat sink.

10. The system of claim 9 wherein said array of heat generating elements correspond to a first plurality of flip-chip circuits disposed on a first surface of a panel array and wherein said panel array is provided having a second opposing surface and wherein said panel array further comprises a second plurality of radiating elements configured to emit and receive radio frequency (RF) signals through the second surface of said panel array.

11. The system of claim 10 wherein said thermal interface is provided having portions of a first surface in thermal contact with said plurality of flip-chip circuits and wherein said mechanical tolerance circuits is configured to accommodate mechanical tolerances in at least three orthogonal directions.

12. The system of claim 10 wherein said heat sink is provided having a surface in thermal contact with said thermal interface.

13. The system of claim 9 wherein said thermal interface further comprises a frame having first and second opposing surfaces,
   wherein the plurality of elevated regions project above one of the first and second opposing surfaces of said frame and each of the plurality of mechanical tolerance circuits is coupled to said frame and to at least one of said plurality of elevated regions.

14. The system of claim 13 wherein a first one of the mechanical tolerance circuits is provided having a single substantially C-shape.

15. The system of claim 13 wherein a first one of the mechanical tolerance circuits is provided having a substantially S-shape.

16. The system of claim 13 wherein a first one of the mechanical tolerance circuits is provided having a substantially double S-shape.

17. The system of claim 9, further comprising a plurality of strain relieved sections comprising members having one or more C-shaped bends to accommodate movement in one direction and extending between at least some of said plurality of elevated regions.

18. The system of claim 17 wherein the plurality of strain relieved sections is a first one of a plurality of strain relieved sections with each of said strain relieved sections provided from at least one channel provided in said frame.

19. The system of claim 17 wherein the members further comprise one or more S-shaped bends to accommodate movement in one direction.

20. A thermal interface comprising:
   a frame having first and second opposing surfaces;
   a first plurality of elevated regions projecting above one of the first and second opposing surfaces of said frame;
   a first plurality of mechanical tolerance circuits, each of the mechanical tolerance circuits coupled between at least one of said plurality of elevated regions and said frame; and
   a second plurality of structural ribbons, each of said second plurality of structural ribbons extending from a first end to a second opposite end of said frame and each of said second plurality of structural ribbons intersecting with a single row of said elevated regions,
   wherein the second plurality of structural ribbons are disposed through the elevated regions to provide the thermal interface with a warp-weave type pattern.

21. The thermal interface of claim 20 wherein a first one of said mechanical tolerance circuits is provided having at least one of a substantially C-shape; a generally S-shape; and a generally triple C-shape.

22. The thermal interface of claim 20 wherein each of said second plurality of structural ribbons is provided having a width which is narrower than a width of the elevated regions.

* * * * *